US011593311B2

(12) United States Patent
Patel

(10) Patent No.: US 11,593,311 B2
(45) Date of Patent: Feb. 28, 2023

(54) COMPRESSION SYSTEM WITH LONGEST MATCH PROCESSING FOR GENERATING COMPRESSED DATA

(71) Applicant: ATI Technologies ULC, Markham (CA)

(72) Inventor: Vinay Patel, Stouffville (CA)

(73) Assignee: ATI TECHNOLOGIES ULC, Markham (CA)

(*) Notice: Subject to any disclaimer, the term of this patent is extended or adjusted under 35 U.S.C. 154(b) by 11 days.

(21) Appl. No.: 16/580,481

(22) Filed: Sep. 24, 2019

(65) Prior Publication Data

US 2021/0089501 A1   Mar. 25, 2021

(51) Int. Cl.
*G06F 16/00* (2019.01)
*G06F 16/174* (2019.01)
*G06F 16/903* (2019.01)

(52) U.S. Cl.
CPC .... *G06F 16/1744* (2019.01); *G06F 16/90335* (2019.01)

(58) Field of Classification Search
CPC ........................ G06F 16/1744; G06F 16/90335
USPC ................................................. 707/600–899
See application file for complete search history.

(56) References Cited

U.S. PATENT DOCUMENTS

| 2018/0157504 A1* | 6/2018 | Chamberlain | G06F 9/4881 |
| 2019/0065494 A1* | 2/2019 | Abali | G06F 16/2255 |
| 2020/0159840 A1* | 5/2020 | Beckman | G06F 16/951 |

* cited by examiner

*Primary Examiner* — Irete F Ehichioya
*Assistant Examiner* — Shirley D Hicks
(74) *Attorney, Agent, or Firm* — Park, Vaughan, Fleming & Dowler LLP

(57) ABSTRACT

An electronic device, including a compression subsystem with a comparator, a history buffer, a match detector, and a command generator, performs operations for generating compressed data from original data. The compression subsystem, starting in each cycle of a clock, processes a search string that is copied from original data to generate commands for compressed data. For processing each search string, the comparator compares each of N substrings from the search string with stored data from the history buffer to find matches between the substrings and the stored data. The match detector then determines a longest match for each of the substrings. The command generator next selectively outputs commands for the compressed data based on the longest matches for the substrings.

24 Claims, 7 Drawing Sheets

COMPRESSION SYSTEM WITH LONGEST MATCH PROCESSING FOR GENERATING COMPRESSED DATA

BACKGROUND

Related Art

Some electronic devices perform operations for compressing data such as user or system files, flows or sequences of data, etc. The electronic devices may compress data to reduce the size of the data to enable more efficient storage of the data in memories, transmission of the data between electronic devices via a network, etc. For example, electronic devices can use a dictionary coding standard such as Lempel Ziv-77 (LZ77), LZ78, or Lempel-Ziv-Welch (LZW) for generating compressed data from original data (i.e., uncompressed data).

Although compressing data can increase the efficiency of storing and handling the data, many devices compress data using software (i.e., a software routine, an application program, etc.). Using software for compressing data typically requires a general-purpose processor such as a central processing unit (CPU) to perform a large number of compression-related operations and associated memory accesses. Due to the large number of compression-related operations and the memory accesses, using software for compressing data is inefficient.

BRIEF DESCRIPTION OF THE FIGURES

Throughout the figures and the description, like reference numerals refer to the same figure elements.

DETAILED DESCRIPTION

Figure 1:
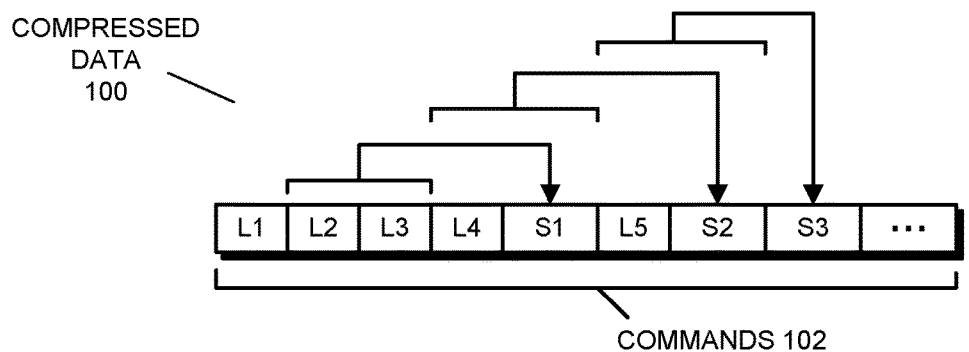
FIG. 1 presents a block diagram illustrating compressed data in accordance with some embodiments.

The following description is presented to enable any person skilled in the art to make and use the described embodiments and is provided in the context of a particular application and its requirements. Various modifications to the described embodiments will be readily apparent to those skilled in the art, and the general principles defined herein may be applied to other embodiments and applications. Thus, the described embodiments are not limited to the embodiments shown, but are to be accorded the widest scope consistent with the principles and features disclosed herein.

Terminology

In the following description, various terms are used for describing embodiments. The following is a simplified and general description of one of these terms. Note that this term may have significant additional aspects that are not recited herein for clarity and brevity and thus the description is not intended to limit the term.

Functional block: functional block refers to a group, collection, and/or set of one or more interrelated circuit elements such as integrated circuit elements, discrete circuit elements, etc. The circuit elements are "interrelated" in that circuit elements share at least one property. For example, the interrelated circuit elements may be included in, fabricated on, or otherwise coupled to a particular integrated circuit chip or portion thereof, may be involved in the performance of given functions (computational or processing functions, memory functions, etc.), may be controlled by a common control element and/or a common clock, etc. A functional block can include any number of circuit elements, from a single circuit element (e.g., a single integrated circuit logic gate) to millions or billions of circuit elements (e.g., an integrated circuit memory).

Compressed Data

In the described embodiments, operations are performed for generating compressed data from original data. Generally, compressed data is the output of one or more compression and/or other operations on original data that result in at least some of the original data being replaced by commands and/or other values that can be used to recreate the original data. In the described embodiments, various types of data may be compressed, including user or system files (e.g., audio and/or video files, document files, executable files, operating system files, etc.), flows or sequences of data (e.g., audio and/or video data flows, sequences of data received via a network interface, etc.), data captured from sensors (e.g., cameras and/or microphones, thermometers, vibration sensors, etc.), etc. In the described embodiments, numerous compression standards, algorithms, or formats, or combinations thereof, can be used for compressing data, including dictionary coding standards such as Lempel Ziv-77 (LZ77), LZ78, Lempel-Ziv-Welch (LZW), etc.

The terms "compressed data" and "compression" as used herein apply broadly to operations on original data that result in at least some of the original data being replaced by commands and/or other values that can be used to recreate the original data. As described above, these operations include various coding standards, algorithms, or formats, or combinations thereof. These terms should therefore not be interpreted as being limited only to operations such as dictionary coding compression and/or other operations that may sometimes be regarded as "compression" operations.

FIG. 1 presents a block diagram illustrating compressed data in accordance with some embodiments. As can be seen in FIG. 1, compressed data 100, which can be or be included in a file, a flow or sequence of data, etc., includes a set (i.e., series, sequence, etc.) of commands 102. Generally, each command of commands 102 includes, identifies, and/or refers to information that can be used to acquire and/or generate strings (i.e., of bits, characters, numbers, etc.), also called "symbols," that are to be appended to recreated original data during a decompression operation. In some embodiments, each command includes a set of bits that are organized to represent and/or identify the information that can be used to acquire and/or generate the strings for that command. In some embodiments, the information in commands refers to information outside the commands, e.g., information about separate sources from where command values are to be acquired, information to be used for computations associated with the commands, references to tables, records, or other data structures, etc.

Figure 2:
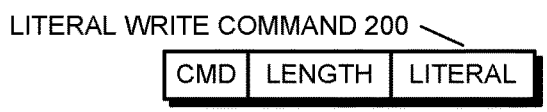
FIG. 2 presents a block diagram illustrating a literal write command in accordance with some embodiments.

In some embodiments, the commands in compressed data include literal write commands and string copy commands. FIG. 2 presents a block diagram illustrating literal write command 200 in accordance with some embodiments. Literal write command 200 includes a command identifier (CMD) that, when processed in a decompression subsystem, causes the decompression subsystem to acquire a literal (LITERAL) of a specified length (LENGTH) (e.g., in bits, bytes, etc.) and append the literal to recreated original data. (Although shown as part of literal write command 200 in FIG. 2, in some embodiments, literals may be stored separately, such as in another portion or block of compressed data 100). For the example in FIG. 1, the L1 literal write command causes a decompression subsystem to acquire a first one byte string, e.g., the character A, and append the first one byte string to recreated output data. "Append" as used herein indicates that a given string is added to the end of a sequence of previously recreated original data (that was recreated using commands that are not shown in FIG. 1) or is used as the initial string in new recreated data (when the command is the first command in compressed data). Continuing the example in FIG. 1, the L2-L5 literal write commands cause second through fifth one byte strings, e.g., the characters B, C, D, and E to be acquired and appended to the recreated original data in corresponding locations.

Figure 3:
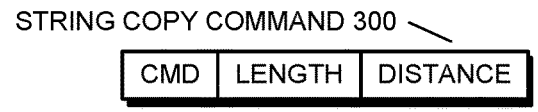
FIG. 3 presents a block diagram illustrating a string copy command in accordance with some embodiments.

FIG. 3 presents a block diagram illustrating a string copy command 300 in accordance with some embodiments. String copy command 300 includes a command identifier (CMD) that, when processed in a decompression subsystem, causes the decompression subsystem to acquire a string of a specified length (LENGTH) (e.g., in bits, bytes, etc.) from a distance (DISTANCE) (e.g., in bits, bytes, etc.) back in previously recreated original data and append the data to recreated original data. Generally, string copy commands enable the decompression subsystem to copy strings of various lengths (perhaps from a minimum to a maximum string length) from earlier in previously recreated original data and add the copies of the strings to the end of recreated original data. For the example in FIG. 1, the S1 string copy command causes the decompression subsystem to copy the string that includes a combination of the literals appended to the recreated original data by literal write commands L2 and L3 starting three bytes back in the previously recreated original data, i.e., B and C, and append the copied string to the recreated original data (in a location following the literal appended to the recreated data by literal write command L4). Following the processing of the S1 string copy command, the recreated original data appears as follows: ABCDBC. The S2 string copy command causes the decompression subsystem to acquire a copy of a string that includes the L4 literal and the S1 string, i.e., DBC, and append the copy of the string to the recreated original data. Following the processing of the S2 string copy command, the recreated original data appears as follows: ABCDBCEDBC. The S3 String copy command causes the decompression subsystem to acquire a copy of a string that includes the L5 literal and S2 strings, i.e., EDBC, and append the copy of the string to the recreated original data. Following the processing of the S3 string copy command, the recreated original data appears as follows ABCDBCEDBCEDBC. As can be seen from the example in FIG. 1, both literals and previous strings, alone or in combination, can be copied and appended to recreated original data using string copy commands.

Although a particular sequence of commands is shown in compressed data 100, in some embodiments, different sequences and/or types of commands can be included in compressed data. Generally, compressed data 100 includes sufficient commands to enable the operations described herein. In addition, although various fields and information is shown as being included in literal write command 200 and string copy command 300, in some embodiments, literal write command 200 and string copy command 300 include different and/or differently arranged information. Generally, literal write command 200 and string copy command 300 include sufficient information to enable the operations described herein. Also, although one byte literals are used as an example in describing FIG. 1, in some embodiments, literals of other lengths can be used. For example, in some embodiments, literals are permitted to be up to two bytes. In addition, in some embodiments, minimum string lengths are used for string copy commands in accordance with the compression standards, algorithms, or formats, or combinations thereof and/or for other reasons. For example, in some embodiments, minimum string lengths are three bytes (and thus the shortest permitted string is three bytes).

In some embodiments, the string copy commands are permitted to copy strings from a "dictionary" that is defined by, and thus includes, a limited amount of recreated original data. In these embodiments, there is a limit as to how far back a string can be in the recreated original data before the string is no longer part of the dictionary for string copy commands. For example, in some embodiments, the dictionary includes a sliding window of 32 kB, 1 kB, or another amount of previously recreated original data. In other words, and assuming a 64 kB dictionary, even where more than 64 kB of previously recreated original data exists, only strings from within the most recently generated 64 kB of the recreated original data can be acquired for processing string copy commands.

In some embodiments, during a compression operation, an electronic device generates compressed data (e.g., compressed data 100) from original data by passing through original data in sections using a sliding window (e.g., a 32 kB sliding window) and determining a dictionary for each section that includes the data in that section. The electronic device then generates, as the compressed data for each section, a sequence of literal write commands, which append literal values of the unique strings to recreated original data, and/or string copy commands, which acquire copies of strings in the dictionary (i.e., in previously recreated original data) and append the copies of the strings to the recreated original data. In some embodiments, and as described above, during a decompression operation, the commands are retrieved from the compressed data and used to recreate the original data using the same dictionary/sliding window/sections.

Overview

In the described embodiments, an electronic device performs operations for creating compressed data from original data. The electronic device includes a compression subsystem functional block that acquires and processes search strings from original data in order to generate commands for the compressed data. During operation, the compression subsystem, in each cycle of a clock, copies a new search string from the original data. The compression subsystem extracts, from each search string, a number of substrings. For example, in some embodiments, the compression subsystem extracts four substrings of eight bytes from a substring of eleven bytes, with each substring including a different eight sequential bytes from the original data. The compression system then, in subsequent cycles of the clock, processes each of the substrings to determine longest matches for the substrings from among stored data in a history buffer and selectively outputs commands for the compressed data based on the longest matches for the substrings.

The compression subsystem includes a comparator, a history buffer, a match detector, and a command generator, each of which is a functional block that performs part of the operations for processing substrings. The comparator receives, as inputs, the separate substrings extracted from the search string (e.g., by a string handler in the compression subsystem). The comparator then uses a set of comparison elements (e.g., combinational logic, etc.) in the comparator to compare each of the substrings extracted from the search string to each possible match in stored data in the history buffer. For example, assuming ten byte substrings, when the history buffer contains thirteen bytes (i.e., bytes 0-12) of stored data, the comparator compares each substring to each of the four possible ten byte sequential combinations of the stored data—i.e., bytes 0-9, 1-10, 2-11, and 3-12 of the stored data. The comparison elements in the comparator return a result for each comparison that indicates a length of the match when a match is found or that no match was found. For example, in some embodiments, the comparison elements return, for each comparison, a bit sequence (e.g., a bit vector) that indicates whether (or not) a match was found for each byte. Note that a "match" is found for a byte of the stored data when each of the bits in a compared byte of the substring have the same value.

The comparator forwards the results of the comparisons, i.e., the indications of the matches, to the match detector. The match detector separately and substantially in parallel (i.e., at or near the same time) processes the indications of the matches for each substring in a respective match pipeline to determine a longest match for the substring. Within each match pipeline are one or more stages of longest match selector functional blocks in sequence, each longest match selector stage reducing the number of longest matches forwarded to the next stage for comparison, and a final longest match selector stage returning an identification of the single longest match for the substring. For example, assuming that three longest match selector stages are found in a match pipeline, a first stage longest match selector may process K matches (e.g., 512, 1000, etc.) and return K/X local matches (e.g., 128, 200, etc.). For instance, the first stage longest match selector may, for each separate group of four matches among the received matches, separately compare two pairs of matches to determine a pair of longest matches that advance to a next pair comparison (and eliminate the two shorter matches from further comparison), the next pair comparison returning a single longest match for the group of four matches. Continuing the example, a second match stage may process the K/X local matches from the first stage and return (K/X)/Y local matches (e.g., 32, 20, etc.), and the third stage longest match stage may process the (K/X)/Y local matches from the second stage and return the single longest match. The longest match returned from the third and final stage is the longest match from among all of the matches received from the comparator for the respective substring. The match detector then forwards, to the command generator, information about the longest matches from each match pipeline, the information including an indication of a length of the match (e.g., a bit sequence representing the match) and a location or address in the history buffer where the stored data associated with the longest match is to be found.

The command generator receives the longest matches from the match detector and selectively outputs one or more commands for the compressed data based on the longest matches. For this operation, the command generator determines literal write commands and/or string copy commands that should be used in accordance with the longest matches. The command generator then outputs the literal write commands and/or string copy commands or otherwise makes the literal write commands and/or string copy commands available to external entities (e.g., a memory, a processor, a network interface, etc.). The command generator "selectively" outputs commands in that whether a command is output for a given longest match depends on the length of a longest match that was found for a prior substring—and commands may not be output for every longest match/substring. The operations performed by the command generator for selectively outputting commands are described in more detail below.

By using the hardware compression subsystem for comparing substrings to stored data and generating commands based on the comparisons, the described embodiments efficiently and quickly perform compression operations using hardware that existing devices perform using software. The compression subsystem is faster and more efficient (e.g., requires less memory accesses, uses less electrical power, etc.) than using a software entity for performing the same operations. In addition, using the compression subsystem frees other functional blocks (e.g., processors, memories, etc.) in the electronic device to perform other operations. The compression subsystem therefore improves the overall performance of the electronic device, which in turn improves user satisfaction.

Search Strings and Substrings

Figure 4:
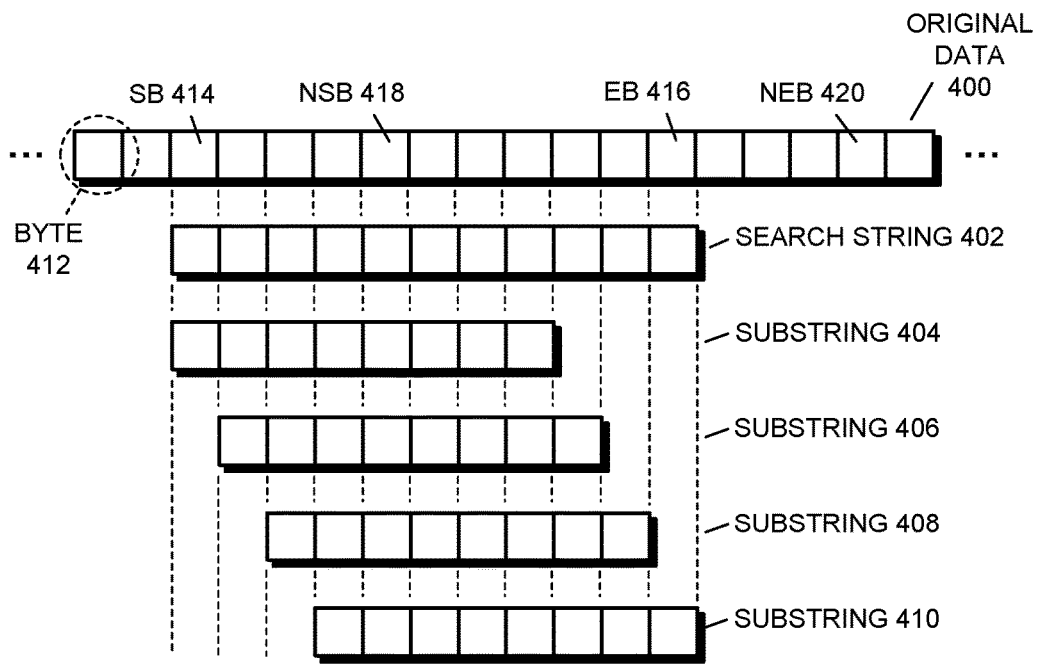
FIG. 4 presents a block diagram illustrating original data, a search string, and a number of substrings in accordance with some embodiments.

In the described embodiments, a compression subsystem performs operations for generating compressed data using search strings and substrings copied from original data. FIG. 4 presents a block diagram illustrating original data 400, search string 402, and substrings 404-410 in accordance with some embodiments. Original data 400 is or includes data to be used to generate compressed data and can be any type of data on or for which the operations described herein can be performed. For example, original data 400 can be or include one or more of: files, streams of data received via a network interface, data acquired from sensors or other data sources, data output by functional blocks in an electronic device, etc. Original data 400 includes a sequence of bytes, only the leftmost of which is labeled as byte 412.

Search string 402 is a copy of a portion of original data 400. In each cycle of a clock, the compression subsystem copies a number of bytes of original data 400 to generate search string 402. As can be seen in FIG. 4, search string 402 is a copy of bytes from original data 400 starting from starting byte (SB) 414 and including sequential bytes (i.e., all bytes, in order) up to ending byte (EB) 416. After copying the bytes from original data 400 in a cycle of the clock, the compression subsystem increments starting byte 414 to a new location, shown in FIG. 4 as next starting byte (NSB) 418, to prepare for copying bytes from original data 400—i.e., from next starting byte 418 to next ending byte (NEB)

420—to a next search string in a next cycle of the clock. In this way, the compression subsystem advances through original data 400 with each cycle of the clock, copying corresponding search strings.

Substrings 404-410 are copies of different parts of search string 402 that are copied from search string 402 and then processed in the compression subsystem to generate commands for the compressed data. In each cycle of the clock, when copying search string 402 from original data 400, the compression subsystem generates, by copying corresponding bytes of search string 402, substrings 404-410. The compression subsystem then processes substrings 404-410 to find longest matches for substrings 404-410, if any such matches exist, and selectively generates commands (e.g., literal write commands and string copy commands) for the compressed data based on the matches found for substrings 404-410.

In the described embodiments, substrings 404-410 are of a specified length in bytes, which is shown in FIG. 4 as eight bytes. In some embodiments, the specified length of substrings 404-410 is chosen and set by a system designer or another entity. For example, the length in bytes of substrings 404-410 can be set based on a tradeoff between the speed and efficiency of compressing data versus the size, complexity, and/or electrical power consumption of processing circuits in the compression subsystem. In addition, the compression subsystem processes a specified number of substrings substantially in parallel (i.e., wholly or partially at the same time) for generating commands. For the example in FIG. 4, the number of substrings processed in parallel is assumed to be four, and thus four substrings 404-410 are generated from search string 402. In some embodiments, the specified number of substrings is chosen and set based on the number and/or arrangement of processing circuits in the compression system. In some embodiments, the number and/or arrangement of processing circuits in the compression system is selected based at least in part on a desired number of substrings to be processed substantially in parallel.

Given that the substrings 404-410 are eight bytes in length and that there are four substrings, search string 402 is of sufficient length to enable four different sequential substrings to be extracted therefrom—and thus is eleven bytes. From the eleven bytes of search string 402, substring 404, which is the first sequential substring (i.e., includes a sequence of bytes that is not completely the same as others of substrings 406-410), includes a copy of the first eight bytes from search string 402, starting from starting byte 414. Substrings 406-410, which are the second through fourth sequential substrings, include eight bytes copied from search string 402 starting from incrementally larger offsets from starting byte 414. The incrementally larger offsets are one byte for substring 406, two bytes for substring 408, and three bytes for substring 410.

As described above, after copying search string 402 from original data 400, the compression subsystem increments starting byte 414 to prepare for the acquisition of a next search string. In some embodiments, the number of bytes by which starting byte 414 is incremented is set based on the number of substrings to be processed substantially in parallel in the compression subsystem. For the example in FIG. 4, the number of substrings, and thus the number of bytes by which the starting byte 414 is advanced in each cycle of the clock, is four. The next starting byte, next starting byte 418, is therefore four bytes from starting byte 414. By advancing the starting byte 414 in this way, the compression subsystem eventually processes substrings that start from every byte in original data 400.

In the described embodiments, in each cycle of the clock, the compression subsystem shifts processed bytes from original data 400 and adds the processed bytes to a history buffer. Generally, the history buffer stores a specified amount of already-processed/previous original data (e.g., 1 kB, 32 kB, etc.) that serves as the dictionary for the compression subsystem. In other words, the history buffer stores the specified amount of already-processed previous original data from which string copy commands are permitted to reach back for copying strings. In some embodiments, the number of processed bytes shifted from original data 400 and added to the history buffer is equal to the number of substrings and the number of bytes by which starting byte 414 is incremented. For the example in FIG. 4, the number of bytes is four—and thus, in each cycle of a clock, four bytes of data are shifted from original data 400 and added to the history buffer.

Although examples of a number of bytes in substrings 404-410 and search string 402 and a number of substrings processed substantially in parallel, and other values dependent thereon, are described with respect to FIG. 4, in some embodiments, different numbers of bytes are present in substrings 404-410 and search string 402 and/or different numbers of substrings are processed substantially in parallel. Generally, the described embodiments are operable with any length of search strings and substrings and/or numbers of substrings processed substantially in parallel. In addition, although a separate search string 402 is used in FIG. 4 and elsewhere herein for explaining various operations (e.g., the generation of substrings 404-410), in some embodiments, a separate search string is not copied—and may not exist and/or be used. In these embodiments, the various operations can be performed using original data 400 directly—e.g., substrings 404-410 are directly copied from original data 400, etc.

Electronic Device

Figure 5:
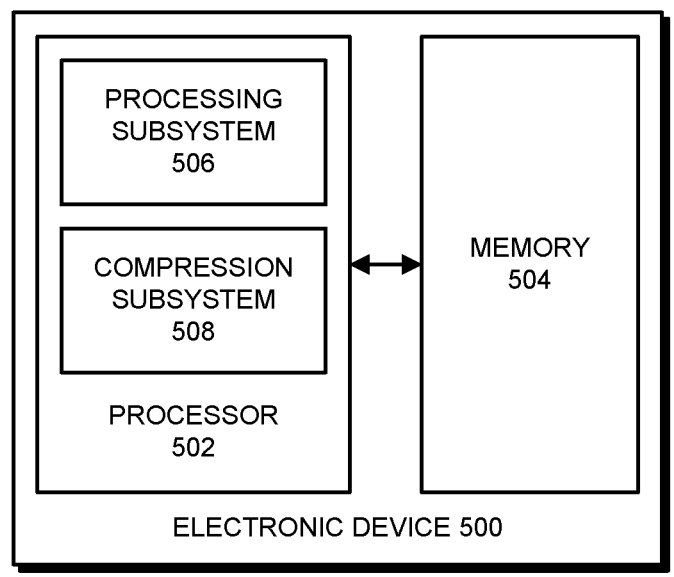
FIG. 5 presents a block diagram illustrating an electronic device in accordance with some embodiments.

FIG. 5 presents a block diagram illustrating electronic device 500 in accordance with some embodiments. As can be seen in FIG. 5, electronic device 500 includes processor 502 and memory 504. Processor 502 is a functional block that performs computational, compression, and other operations in electronic device 500. Processor 502 includes processing subsystem 506 and compression subsystem 508. Processing subsystem 506 includes one or more functional blocks such as central processing unit (CPU) cores, graphics processing unit (GPU) cores, embedded processors, and/or application specific integrated circuits (ASICs) that perform general purpose computational, compression, and other operations.

Compression subsystem 508 is a functional block that performs operations for generating compressed data from original data. Generally, compression subsystem 508 takes, as input, original data (e.g., a file, a stream of data, etc.) and returns, as output, commands to be included in compressed data (i.e., commands from a dictionary coding standard being used for compressing the original data). As described above, the commands in compressed data can be subsequently processed in a decompression subsystem (not shown) and/or a software application in electronic device 500 or another electronic device in order to recreate the original data. Based on the arrangement of functional blocks in compression subsystem 508 (e.g., a number of separate comparators, match pipelines, etc.), compression subsystem 508 generates and outputs up to a specified number of commands per time period (e.g., 1-4 commands per cycle of the clock, 1-5 commands every 333 ps, etc.). Compression subsystem 508 is described in more detail below.

Memory 504 is a functional block that performs operations of a memory (e.g., a main memory) in electronic device 500. Memory 504 includes memory circuits (i.e., storage elements, access elements, etc.) for storing data and instructions for use by functional blocks in electronic device 500, as well as control circuits for handling accesses (e.g., reads, writes, checks, deletes, invalidates, etc.) of data and instructions in the memory circuits. The memory circuits in memory 504 include computer-readable memory circuits such as fourth-generation double data rate synchronous dynamic random access memory (DDR4 SDRAM), static random access memory (SRAM), or a combination thereof.

Electronic device 500 is shown using particular numbers and arrangements of elements (e.g., functional blocks and devices such as processor 502, memory 504, etc.). Electronic device 500, however, is simplified for illustrative purposes. In some embodiments, a different number or arrangement of elements is present in electronic device 500. For example, electronic device 500 may include power subsystems, displays, etc. Generally, electronic device 500 includes sufficient elements to perform the operations herein described.

Although compression subsystem 508 is shown in FIG. 5 as being included in processor 502, in some embodiments, compression subsystem 508 is a separate and/or standalone functional block. For example, compression subsystem 508 might be implemented (by itself or with supporting circuit elements and functional blocks) on a standalone integrated circuit chip, etc. Generally, in the described embodiments, compression subsystem 508 is suitably situated in electronic device 500 to perform the operations herein described.

Figure 6:
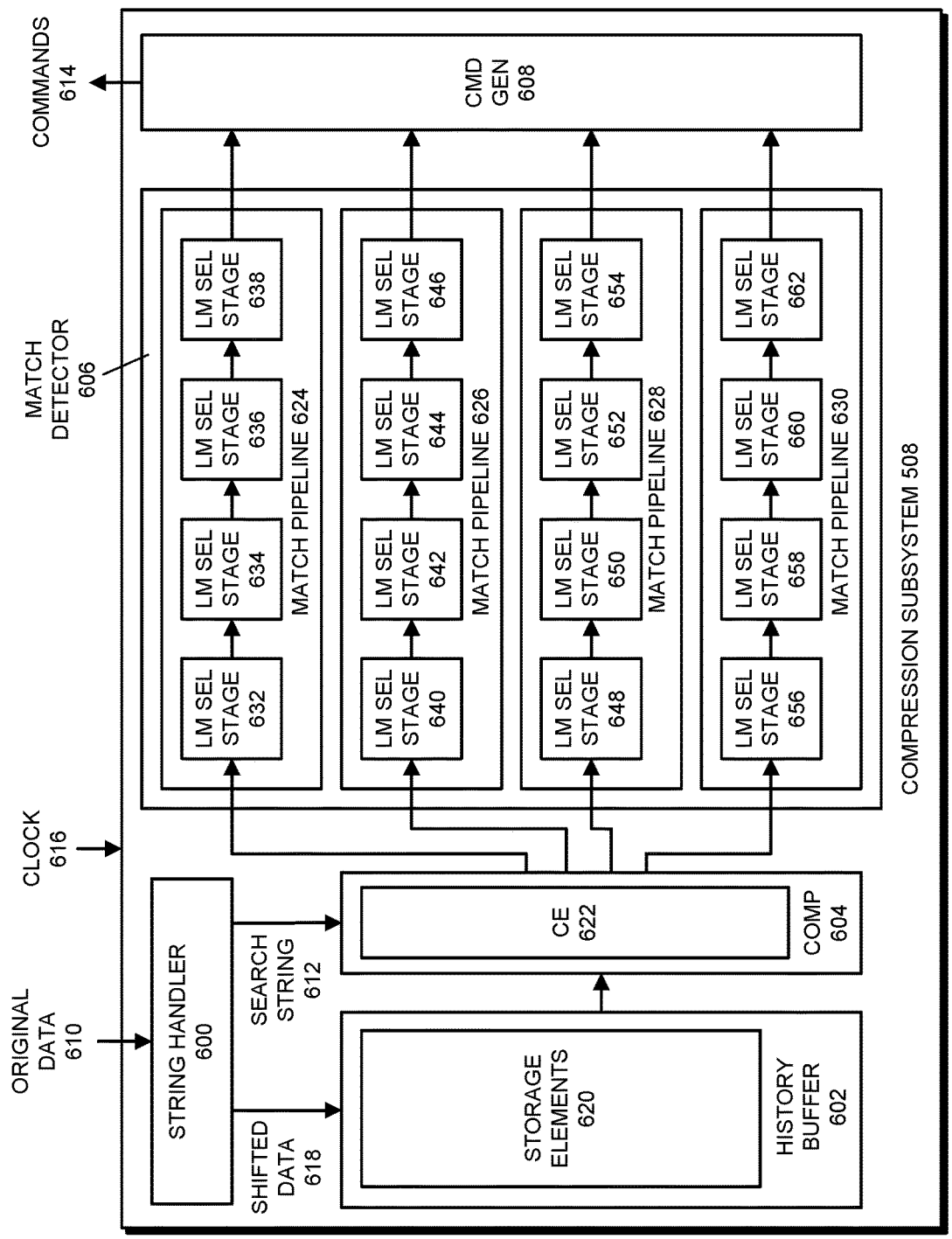
FIG. 6 presents a block diagram illustrating a compression subsystem in accordance with some embodiments.

Electronic device 500 can be, or can be included in, any electronic device that performs data compression or other operations. For example, electronic device 500 can be, or can be included in, electronic devices such as desktop computers, laptop computers, wearable electronic devices, tablet computers, smart phones, servers, artificial intelligence apparatuses, virtual or augmented reality equipment, network appliances, toys, audio-visual equipment, home appliances, controllers, vehicles, etc., and/or combinations thereof Compression Subsystem In the described embodiments, a compression subsystem performs operations for generating compressed data from original data. In other words, the compression subsystem, in accordance with a coding standard such as a dictionary coding standard, generates sequences of commands based on original data that serve as the compressed data. FIG. 6 presents a block diagram illustrating compression subsystem 508 in accordance with some embodiments. As can be seen in FIG. 6, compression subsystem 508 includes string handler 600, history buffer 602, comparator (COMP) 604, match detector 606, and command generator 608.

String handler 600 is a functional block that performs operations for handling original data 610 for compression subsystem 508. Among the operations performed by string handler 600 are generating and providing search string 612 to comparator 604. As described above, search string 612 is a copy of a number of bytes from original data 610 that is processed in compression subsystem 508 to generate commands 614 for compressed data. For generating search string 612, string handler 600 keeps a record of a starting byte in original data 610 (e.g., similar to starting byte 414). In each cycle of clock 616, string handler 600 uses the record of the starting byte to copy the number of bytes from the identified location in original data 610 for generating search string 612. String handler 600 then provides search string 612 to comparator 604 for processing therein. As described above, the number of bytes in search string 612 depends on the number and length of substrings to be processed in compression subsystem 508. For example, when four substrings sixteen bytes in length are to be processed in compression subsystem 508, string handler 600 copies nineteen bytes from original data 610 for search string 612.

Another operation performed by string handler 600 is shifting data from original data 610 to generate shifted data 618 and then adding shifted data 618 to history buffer 602. In each cycle of clock 616, after providing search string 612 to comparator 604, string handler 600 shifts a number of bytes from original data 610, thereby generating shifted data 618. String handler 600 then adds the shifted data 618 to history buffer 602, where shifted data 618 serves as part of a dictionary for generating commands for compressed data (as described in more detail below). For this operation, string handler 600 (or history buffer 602) shifts shifted data 618 into the lower positions in history buffer 602, which causes existing data (if any is present in history buffer 602) to be shifted from lower positions to higher positions in history buffer 602. As used herein, "shifting" bytes of data involves removing the number of bytes of data in first-in-first-out order from the sequence of original data 610 (as the bytes of original data 610 were received in order by compression subsystem 508), leaving remaining original data 610 for operations in subsequent cycles of clock 616. In this description, the bytes shifted from search string 612, and, more generally, data stored in history buffer 602, can be referred to as "previously processed data" or the like, as the shifted bytes have commenced being processed as part of a search string before being shifted as described herein. As described above, the number of bytes by which string handler 600 shifts original data 610 depends on the number of substrings to be processed in compression subsystem 508. For example, when four substrings are to be processed in compression subsystem 508, string handler 600 shifts original data 610 by four bytes each cycle of clock 616.

Another operation performed by string handler 600 is incrementing the starting byte after providing search string 612 to comparator 604 and shifting data from original data 610 in each cycle of clock 616. For this operation, string handler 600 increments the recorded starting byte by a specified number of bytes, which updates/sets the starting byte to prepare for copying bytes from original data 610 to search string 612 in a subsequent cycle of clock 616. By incrementing the starting byte, string handler 600 ensures that compression subsystem 508 makes progress through original data 610 (over the course of a number of cycles of the clock) to generate commands for compressed data. As described above, the number of bytes by which string handler 600 increments the starting byte depends on the number of substrings to be processed in compression subsystem 508. For example, when four substrings are to be processed in compression subsystem 508, string handler 600 increments the starting byte by four bytes each cycle of clock 616.

History buffer 602 is a functional block that performs operations for storing previously processed data for use by comparator 604 and possibly other entities. History buffer 602 includes storage elements 620, which are sequential logic storage elements such as flip-flops, latches, etc. that are used for storing and accessing the data in history buffer 602. The sequential logic storage elements in history buffer 602 are located closely to comparator 604 and are coupled to comparator 604 by relatively direct signal routes. For example, in some embodiments, the sequential logic storage elements 620 are proximal to or neighbor comparator 604 in a semiconductor layout in which storage elements 620 and comparator 604 are fabricated and are coupled to comparator 604 via relatively direct communication routes in the semiconductor layout. For this reason, comparator 604 can access the previously processed data in storage elements 620 quickly (e.g., within a single cycle of clock 616) for performing string comparisons or other operations.

During operation, history buffer 602 (and, more specifically, storage elements 620) functions as a shift chain, so that history buffer 602 receives shifted data 618 from string handler 600 and shifts shifted data 618 onto existing data in storage elements 620 in first-in-first-out order. In other words, history buffer 602 shifts existing data (if any is present) from lower positioned storage elements to higher positioned storage elements in sequence and shifted data 618 is stored in the lower positioned storage elements that were freed by shifting the existing data. In this way, data in history buffer 602 "flows" (i.e., is shifted) in a given direction through history buffer 602. As an outcome of this operation, a given set of lowest positioned storage elements 620 (e.g., the lowest N bytes) should hold the newest shifted data after each clock cycle. Once shifted data 618 has been shifted into storage elements 620, the data is available for use by comparator 604 and possibly other entities.

In some embodiments, history buffer 602 serves as a dictionary in accordance with a coding standard in use in compression subsystem 508, and thus stores only a limited amount of previously processed data (e.g., 1 kB, 32 kB, etc.). In these embodiments, storage elements 620 have a limited amount of storage capacity for storing previously processed data. Upon storage elements 620 becoming full of previously processed data, a next shift operation for shifting in new shifted data 618 will cause some of the existing data in history buffer 602 to be dropped or discarded (i.e., to be shifted beyond a highest position of storage elements 620). In this way, incoming shifted data "pushes" existing data out of history buffer 602 when history buffer 602 is full.

Comparator 604 is a functional block that performs operations comparing substrings from search string 612 to stored data (i.e., stored previously processed data) from history buffer 602 to find matches, if any, between the stored data and the substrings. Recall that, as described above, each substring is a copy of a specified number of bytes from search string 612 starting from a respective byte offset from a starting byte in search string 612. In operation, each substring is to be compared to each possible sequence of stored data in history buffer 602 to determine whether a match exists and, if so, a length of the match (i.e., a number of matching bytes). This means that, starting from a first byte of the stored data, each substring is to be compared to a sequence (or string) of data at every byte offset in storage elements 620. For example, if history buffer 602 stores 1000 bytes of data, the substrings are sixteen bytes in length, and a minimum length for a match is three bytes (in accordance with the coding standard, etc.), 997 separate comparisons are to be performed. In other words, a given sixteen byte substring is to be compared to the sixteen bytes of stored data starting from a first byte of the stored data, compared to the sixteen bytes of stored data starting from a second byte of the stored data, compared to the sixteen bytes of stored data starting from a third byte of the stored data, and so forth, up to the 997th byte of the stored data (the remaining bytes are not compared due to string length).

Comparison elements (CE) 622 is a functional block that is or includes an array, tree, or other arrangement of combinational logic (e.g., AND gates, etc.) and/or other elements (e.g., complex logic gates, latches, etc.) that perform the individual, i.e., bit-by-bit, comparisons between the substrings and the stored data. Comparison elements 622 return a result for each comparison that indicates a length of the match when a match is found—or that no match was found. For example, in some embodiments, comparison elements 622 return, for each comparison, a bit sequence (e.g., a bit vector) that indicates whether (or not) a match was found for each byte. For instance, in some embodiments, and continuing the sixteen byte substring example, if a match was found between the first eight bytes for a given substring and stored data from the history buffer 602, and thus an eight byte match was found, the bit sequence returned by comparison elements 622 would be 1111111100000000. As another example, in some embodiments, comparison elements 622 return a count of a run of matching bytes.

Match detector 606 is a functional block that performs operations for determining, based on indications of matches received from comparator 604, a longest match found for each substring—or that no match was found for the substring. Match detector 606 includes a number of match pipelines 624-630, which include longest match selector (LM SEL) stages 632-638, 640-646, 648-654, and 656-662, respectively. Each match pipeline is used for reducing the longest matches found by comparator 604 for the corresponding substring until a single longest match is output by a final stage in that match pipeline (e.g., longest match selector stage 638 in match pipeline 624). The longest match output by the final stage is the longest match (or is a chosen one of two or more longest matches of the same length), in terms of bytes that match between the respective substring and the stored data, in the matches received from comparator 604. In some embodiments, in addition to the longest match, each match pipeline keeps track of and outputs a location in storage elements 620 (e.g., an absolute or relative address, byte offset, etc.) where the stored data for the longest match was found and/or other information about the longest match. In these embodiments, the location of the stored data for the longest match can be kept using tags or other identifiers that are propagated with matches, can determine the location of the stored data based on sources (i.e., the particular comparison elements) in comparator 604 for matches, etc.

For reducing the matches when finding the longest match, the longest match selection stages in the match pipelines compare groups of matches of a specified size to each other and select a longest match based on the comparison. For stages other than the final stage, the results of the comparison, i.e., "local" longest matches, are provided to the next stage to be compared (and reduced) therein. The group of matches provided from each stage is therefore smaller than the group of matches that was received by that stage. For example, each longest match selection stage in each match pipeline (e.g., longest match selection stages 632-638, etc.) may perform a 4:1, 16:1, or other size of match reduction. For instance, assuming that 1024 matches are provided by comparator 604 to match detector 606 for each substring, the first longest match selection stage in a given match pipeline may reduce the received 1024 matches to 256 matches (i.e., a 4:1 reduction), the second longest match selection stage may reduce the 256 matches from the first stage to 64 matches, the third longest match selection stage may reduce the 64 from the second stage to 16 matches, and the final match stage may reduce the 16 matches from the third stage to the single longest match (i.e., a 16:1 reduction). Each longest match selection stage compares groups of matches using one or more internal longest match selector functional blocks—and possibly multiple comparison steps—to find the longest match of each group of matches. For example, a 4:1 reduction may involve an internal longest match selector functional block performing one 4:1 comparison step, two 2:1 comparison steps in parallel followed by third 2:1 comparison step, etc.

Command generator 608 is a functional block that performs operations for outputting commands based on the longest matches and related information received from the match pipelines. In other words, command generator 608 uses the longest matches to determine commands to be output for the compressed data. Generally, the commands are commands for compressed data in accordance with the coding standard, such as literal write commands and string copy commands for a dictionary compression standard. The commands from the compressed data can be subsequently and separately processed in a decompression system, in a software application, etc. to recreate the original data.

Command generator 608 "selectively" outputs commands for the compressed data based on the longest matches for the substrings. Selectively outputting commands based on longest matches means that the longest matches output from the match pipelines can be, but are not required to be, used to generate a command for the compressed data. Whether a given longest match is used for generating a command depends on prior longest matches, and thus commands, in the same cycle of the clock or earlier cycles of the clock. Sufficiently long longest matches in one match pipeline render subsequent longest matches in some or all of the match pipelines unusable for generating commands in a given cycle of the clock and possibly one or more later cycles of the clock, as described in more detail below.

Figure 7A:
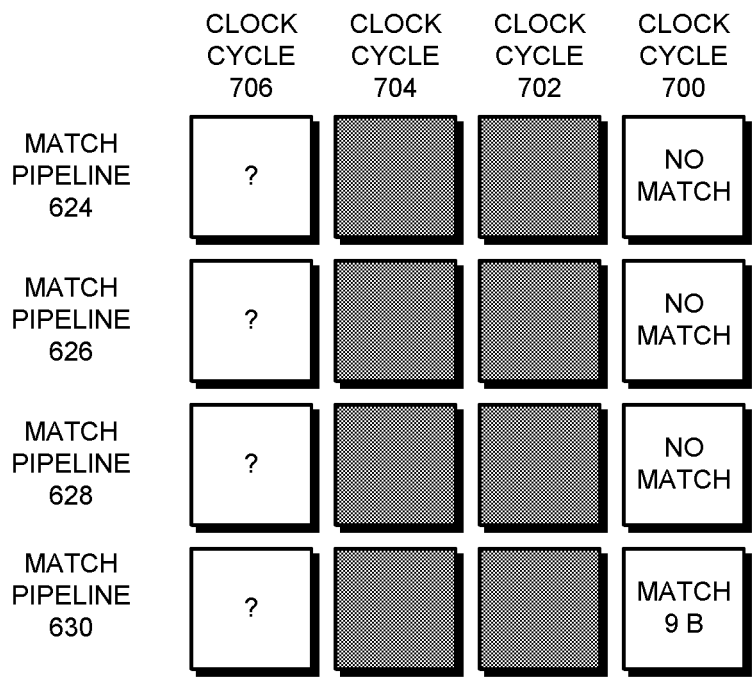
FIG. 7A presents a block diagram illustrating selectively outputting commands for compressed data in accordance with some embodiments.
Figure 7B:
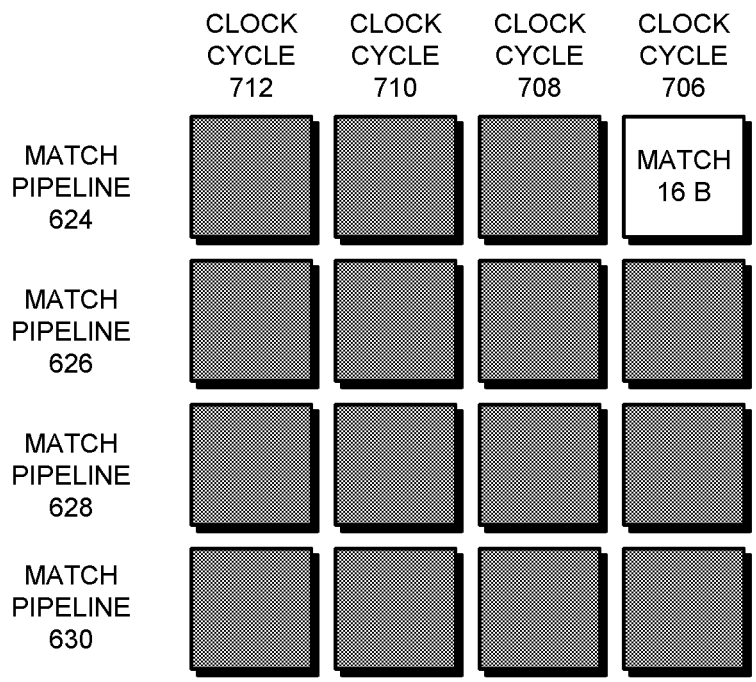
FIG. 7B presents a block diagram illustrating selectively outputting commands for compressed data in accordance with some embodiments.

FIGS. 7A-7B present a block diagram illustrating selectively outputting commands for compressed data in accordance with some embodiments. For the example in FIGS. 7A-7B, each square represents a longest match output from one of match pipelines 624-630 in each cycle of clock 616 from a first cycle of the clock, i.e., clock cycle 700, up to and including a final cycle of the clock, i.e., clock cycles 702-712. In other words, in each of clock cycles 700-712, each of match pipelines 624-630 provides a longest match output that represents a length of a longest match found by that match pipeline—and these matches are shown in FIGS. 7A-7B using squares (the values of the longest matches are not shown in some of the squares for clarity). Also, it is assumed for FIGS. 7A-7B that the substrings are sixteen bytes in length, although this is not a requirement.

For the example in FIGS. 7A-7B, recall that, as shown in FIG. 4, the starting byte for each substring is offset from the next substring by a byte, and thus, in a given cycle of the clock (e.g., clock cycle 700, etc.), a substring for which the matches were processed in match pipeline 624 includes all of the bytes of the substring for which the matches were processed in match pipeline 626 with the exception of the last byte, and so forth for the substrings for which the matches were processed in match pipelines 626-630.

In terms of being used for generating commands, in each cycle of the clock, the longest matches output from match pipelines 624-630 are considered in order by command generator 608 from match pipeline 624 to match pipeline 630. Generally, given the above-described overlap in the substrings for which longest matches are being processed in match pipelines 624-630, when a longest match longer than one byte is found in match pipeline 624 in clock cycle 700, the longest match includes at least the first byte of the substring being processed in match pipeline 626 in clock cycle 700. In this case, any longest match found in match pipeline 626 in clock cycle 700 is rendered unusable for generating commands due to the longest match found in match pipeline 624. This is true because a next longest match (i.e., that follows the longest match found in match pipeline 624) does not start until after a last byte of the longest match found in match pipeline 624—and therefore cannot start from the first byte of the substring being processed in match pipeline 626. It is possible, in fact, that a longest match in match pipeline 624 is sufficiently long (i.e., four bytes) that the next longest match will not start from a starting byte of any other substring for which a longest match is output from match pipelines 626-630 in clock cycle 700. It is further possible that a longest match found in match pipeline 624 is sufficiently long (i.e., five or more bytes) that a longest match will not start from a starting byte of any substring for which a longest match is output from match pipelines 626-630 in clock cycle 702—or clock cycles 704-706. In some embodiments, longest matches of sixteen bytes are permitted (as are significantly longer matches, as described below). When a sixteen byte longest match is found in match pipeline 624 in clock cycle 700, the next longest match will not start from starting bytes of any substring currently being processed in match pipelines 624-630 in FIG. 7A, i.e., will not be found in clock cycles 702-706. When a longest match is rendered unusable due to a prior longest match of sufficient length, the longest matches are discarded and are not used for generating commands. Commands are therefore selectively output (i.e., are or are not output) from command generator based on the longest matches for the substrings.

For the example in FIG. 7A, it is assumed that no match and/or a longest match of less than a threshold number of bytes (e.g., three bytes, etc.) is found for the substring being processed in each of match pipelines 624-628 in clock cycle 700. This can occur when a substring, starting from the first byte, does not match (such as with a substring that has not yet been encountered in previously processed original data) or only matches a few bytes in the stored data. In this case, command generator 608 outputs, for each of match pipelines 624-630, to the compressed data, a literal write command for writing only the first byte of the substring. In other words, command generator 608 outputs three separate literal write commands for each of three one byte literals in the first byte of each these substrings. Note that, because literals are only one byte, none of the literal write commands affect the bytes of subsequent substrings—and command generator 608 can generate commands for longest matches from subsequent match pipelines.

Continuing with FIG. 7A, it is assumed that a longest match of nine bytes (9 B) is found for the substring being processed in match pipeline 630 in clock cycle 700. In other words, starting from the first byte of the sixteen byte substring for which the matches were processed in match pipeline 630, the longest match (although possibly not the only match) found in stored data was for the first nine bytes of the substring. This means that a nine byte string at a given location in previously processed original data in storage elements 620 (i.e., the dictionary) can be used to recreate the substring. Command generator 608 therefore outputs, to the compressed data, a string copy command for copying the nine byte string from the location in the previously processed original data/dictionary.

Because the longest match for match pipeline 630 in clock cycle 700 is nine bytes in length, at least the first bytes for each of the next eight substrings processed in match pipelines 624-630 are included in the longest match. The longest matches from these substrings are therefore rendered unusable, as shown via shading in the next eight longest matches returned in clock cycles 702-704. From the perspective of clock cycle 700, the longest matches found in match pipelines 624-630 in clock cycle 706 are marked with question marks. This is to show that these longest matches are candidates for having commands generated based thereon. This is true because the substrings processed by match pipelines 624-630 to generate the longest match outputs in clock cycle 706 are not yet known (i.e., in clock cycle 700) to be overlapped by a longest match for a prior substring.

Note that, although the speculative computational work in processing the substrings for clock cycles 702-704 is lost when the longest matches are discarded/ignored by command generator 608 due to the nine byte match in match pipeline 630 in clock cycle 700, a longest match of relatively long length was found in match pipeline 630 in clock cycle 700—and thus progress is made. In addition, had the longest match not been found in clock cycle 700 and/or been shorter in length, some or all of the longest matches found in clock cycles 702-704 may have been useful.

For clock cycles 702 and 704, all the longest matches from match pipelines 624-630 are discarded and no commands are output. As shown in FIG. 7B, which presents clock cycles 706-712, a sixteen byte (16 B) longest match is found in match pipeline 624 in clock cycle 706. In this case, in some embodiments, because the match may continue beyond the clock cycles shown in FIG. 7B—and thus may be up to a maximum longest match length in accordance with the coding standard in use, e.g., 255 bytes—command generator 608 does not immediately generate a command. Instead, command generator 608 records the occurrence and location in storage elements 620 of the sixteen byte match and monitors subsequent clock cycles to determine if the match continues, i.e., if a one or more subsequent substrings encounter further matching bytes after the matching bytes in the substring from which the longest match was found in match pipeline 624 in clock cycle 706. When the longest match later turns out to be only sixteen bytes (and thus no further matching was found), command generator 608 outputs a string copy command for copying the sixteen byte string from the location in the previously processed original data/dictionary. Otherwise, if the longest match is longer than sixteen bytes, command generator 608 outputs a string copy command for copying the bytes of the entire matching string from the location in the previously processed original data/dictionary.

Although a specific number and arrangement of functional blocks is presented in compression subsystem 508 and match detector 606 in FIG. 6, in some embodiments, different numbers and/or arrangements of functional blocks are present in compression subsystem 508 and/or match detector 606. For example, in some embodiments, match detector 606 includes a different number of match pipelines. Generally, compression subsystem 508 and match detector 606 include sufficient functional blocks to perform the operations herein described.

Although longest matches from match pipelines 624-630 are described as being used to generate commands in order from match pipeline 624-630, this is not a requirement. In some embodiments, command generator 608 selectively uses longest matches for generating commands based on relative lengths of the longest matches—which can help to improve compression. In these embodiments, command generator 608 determines the length of the longest match for each of match pipelines 624-630 and then disregards early shorter longest match(es) in order to generate string copy commands for a subsequent longer longest match. For example, when match pipelines 624-626 have longest matches of three bytes and twelve bytes, if the three byte longest match for match pipeline 624 was to be used for generating a string copy command then the twelve byte match in pipeline 626 would be skipped as described above. In these embodiments, based on the relative lengths of the longest matches, command generator 608 issues a literal write command for match pipeline 624, thereby disregarding the longest match for match pipeline 624, and generates a twelve-byte string copy command for the longest match from match pipeline 626.

Operations Performed in Cycles of a Clock

Figure 8:
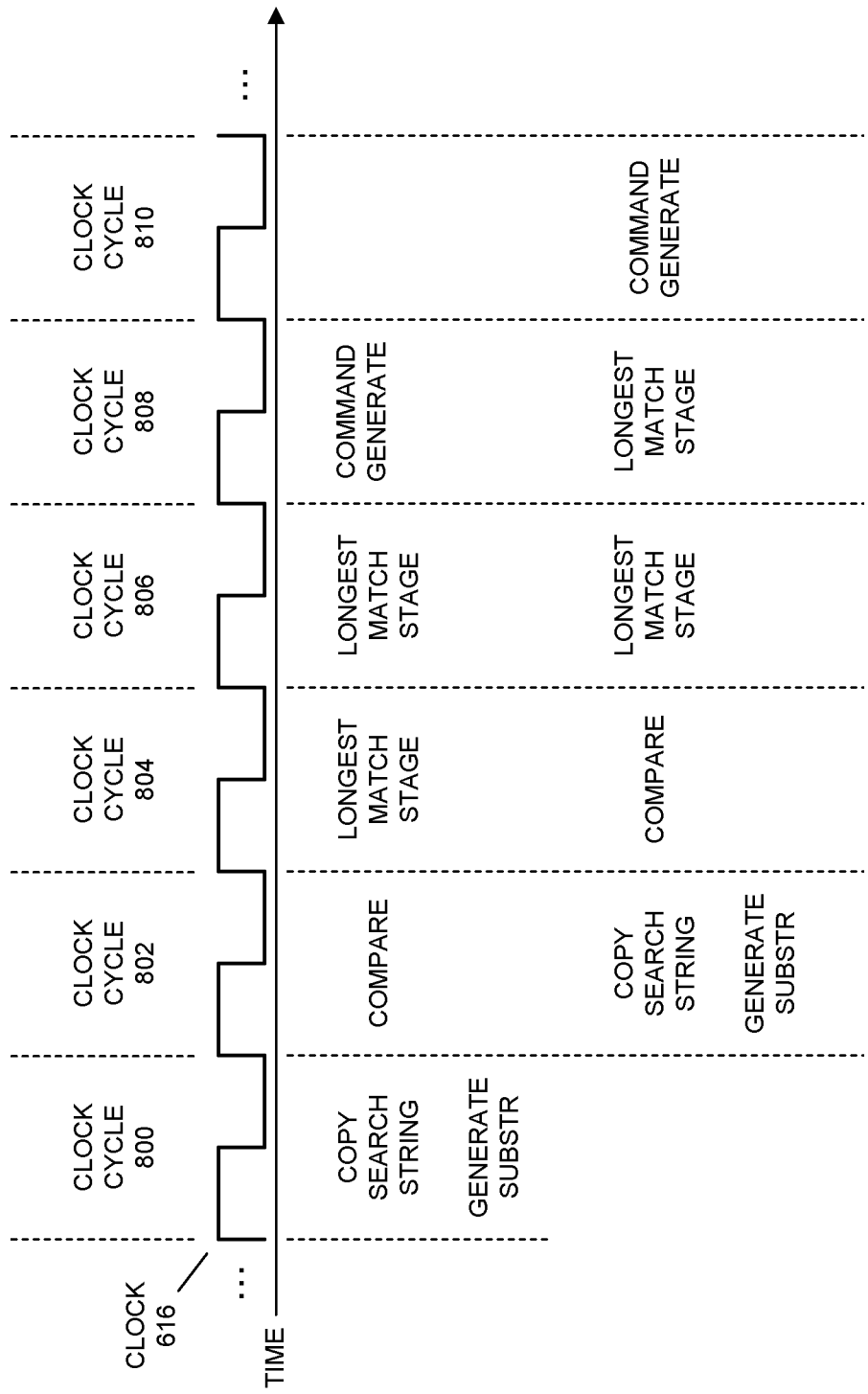
FIG. 8 presents a timeline diagram of operations performed by a compression subsystem during cycles of a clock in accordance with some embodiments.

In some embodiments, a compression subsystem uses edges, levels, transitions, etc. of a clock signal during cycles of the clock to control the performance of operations for generating compressed data from original data. FIG. 8 presents a timeline diagram of operations performed by a compression subsystem during cycles of a clock in accordance with some embodiments. For the example in FIG. 8, it is assumed that compression subsystem 508 performs the operations and thus the clock is clock 616. In order to fit FIG. 8 on a single page, however, only two of the four longest match selection stages of compression subsystem 508 are shown.

Clock 616 is generally a signal that alternates between two voltage levels in cycles, i.e., rises and falls in cycles, as time progresses (from left to right, as shown by the time arrow). As can be seen in FIG. 8, as time progresses, clock 616 makes clock cycles 800-810. Within compression subsystem 508, clock 616 controls and synchronizes when functional blocks and circuit elements commence and/or perform operations. In other words, edges, levels, transitions, etc. of clock 616 trigger and synchronize the operations of functional blocks and circuit elements in compression subsystem 508.

Compression subsystem 508 is divided into a number of stages, blocks, or phases by circuit elements controlled by clock 616 (e.g., latches, flip flops, transmission gates, switches, etc.). Each stage, block, or phase performs its operations during each cycle of the clock. Information can therefore flow from a given stage, block, or phase to a next stage, block, or phase, in consecutive cycles of the clock. For the example in FIG. 8, in clock cycle 800, string handler 600 copies search string 612 from original data 610 and provides search string 612 to comparator 604, which generates substrings from search string 612. In clock cycle 802, the substrings are compared in comparison elements 622 to stored data from storage elements 620 in history buffer 602 to find matches for the substrings. In clock cycle 804, a first longest match selection stage in a respective match pipeline in match detector 606 processes the matches for each substring from comparator 604 to determine local longest matches for that substring. In clock cycle 806, a second longest match selection stage in the respective match pipeline in match detector 606 processes the local longest matches for each substring from the first match stage to determine a longest match for that substring. In clock cycle 808, command generator 608, using the longest matches from each of the match pipelines, selectively outputs commands for the compressed data.

In an effort to keep the functional blocks and circuit elements in compression subsystem 508 busy, processing for a next search string 612 is commenced in clock cycle 802 and proceeds through clock cycle 810. In other words, after string handler 600 and comparator 604 have completed the operations in clock cycle 800, string handler 600 and comparator 604 perform the same operations for a new search string. The new search string progresses through the stages, blocks, or phases in compression subsystem 508 as did the above-described search string, albeit one cycle of the clock later in each stage, block, or phase. Although not shown in FIG. 8, this pattern of operations, with compression subsystem 508 commencing processing for a new search string 612 from original data 610 in each cycle of the clock, continues until all the original data has been processed in compression subsystem 508.

Although particular operations are shown as being performed in respective cycles of the clock, in some embodiments different operations are performed and/or are performed in different cycles of the clock. For example, in some embodiments, the copying of the search string, generation of substrings, and comparison may occur in the same cycle of the clock. Generally, in the described embodiments, cycles of clock 616 are used for triggering/causing and synchronizing operations in compression subsystem 508.

Process for Compressing Input Data

Figure 9:
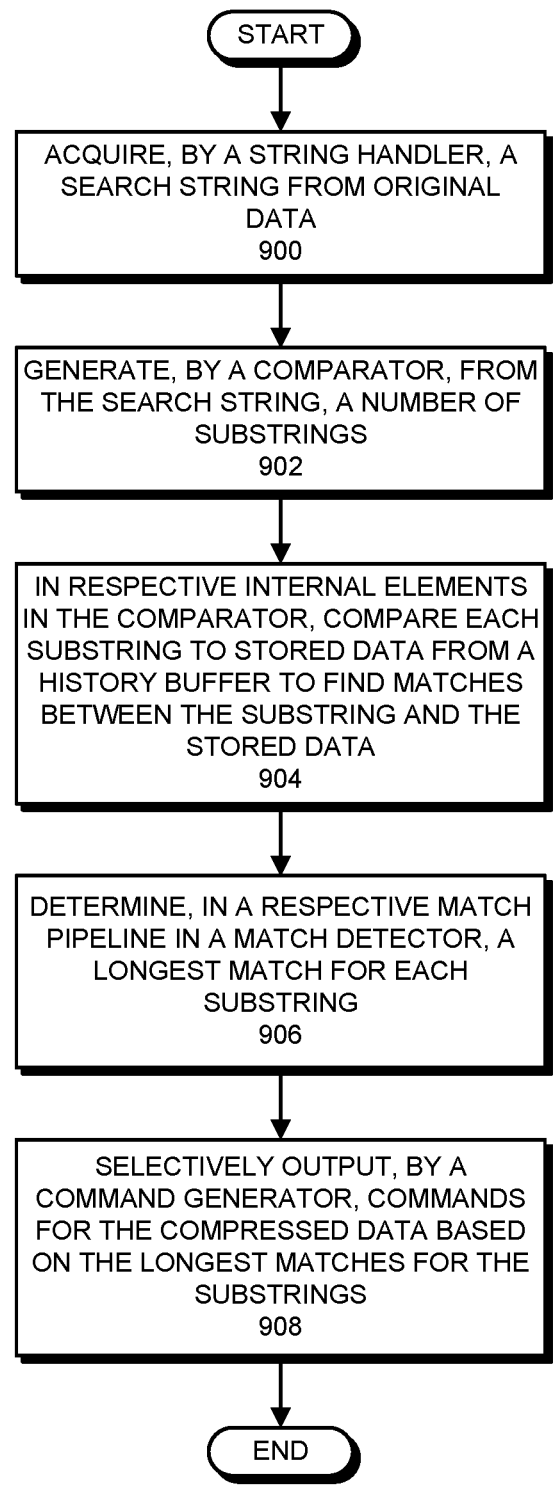
FIG. 9 presents a flowchart illustrating a process for compressing original data to generate commands for compressed data in accordance with some embodiments.

In the described embodiments, a compression subsystem (e.g., compression subsystem 508) that includes a string handler, a history buffer, a comparator, a match detector 606, and a command generator (e.g., string handler 600, history buffer 602, comparator 604, match detector 606, and command generator 608) performs operations for compressing original data (e.g., original data 610) to generate commands (e.g., commands 614) for compressed data. FIG. 9 presents a flowchart illustrating a process for compressing original data to generate commands for compressed data in accordance with some embodiments. Note that the operations shown in FIG. 9 are presented as a general example of operations performed by some embodiments. The operations performed by other embodiments include different operations, operations that are performed in a different order, and/or operations that are performed by different entities or functional blocks.

For the process shown in FIG. 9, it is assumed that the compression subsystem receives original data from a source such as a file, a stream of data, etc. In other words, individual bytes of the original data are received by the compression subsystem and thus are available to be operated on by the functional blocks in the compression subsystem. In some embodiments, the compression subsystem simply (and possibly only) compresses original data that is provided to the compression subsystem by another entity (e.g., a processing subsystem, a memory) to generate commands for compressed data. In other words, in these embodiments, the compression subsystem does not perform operations other than outputting commands that were generated based on original data provided to the compression subsystem. In some embodiments, however, the compression subsystem includes functional blocks for performing other operations, such as retrieving original data from memory and/or other locations or entities (e.g., the processing subsystem, network interfaces, IO devices, etc.), for storing the generated commands in memory and/or providing the commands to other entities, etc.

For the example in FIG. 9, at least some of the functional blocks in the compression subsystem perform certain operations "substantially in parallel," in that these operations are performed at approximately the same time (e.g., in the same cycle(s) of a clock, etc.). For example, the comparison operation in step 904 can be performed substantially in parallel for each substring and the stored data from the history buffer. As another example, the determination of longest matches for each substring in step 906 can be performed substantially in parallel.

The process in FIG. 9 starts when the string handler acquires a search string (e.g., search string 612) from original data (step 900). For this operation, the string handler copies, from the original data, a specified number of bytes to be processed in the compression subsystem. The string handler then provides the search string to the comparator, which generates a number of substrings from the search string (step 902). During this operation, the comparator generates each substring by copying a different sequence of a given number of bytes from the search string. A first of the substrings (e.g., substring 404) includes the given number of bytes from the search string starting from a starting byte of the search string (e.g., search string 402) and each next substring (e.g., substrings 406-410) includes the given number of bytes from the search string starting from an incrementally larger offset in bytes from the starting byte.

The comparator next compares, in respective comparison elements, each substring to stored data from a history buffer to find matches between the substrings and the stored data (step 904). For this operation, assuming that the substrings are N bytes in length, separate comparison elements compare each possible N byte sequence in the stored data (i.e., byte sequences 0 to N−1, 1 to N, 2 to N+1, etc.) to each substring substantially in parallel. Each separate internal element provides an output indicating whether a match was found (or not) and how long the match is and a position in the history buffer where the matching data is located. For example, in some embodiments, each internal element outputs a representation of the match or lack thereof such as a numerical value, a bit sequence, a match length and offset, etc. as well as a value indicating the position in the history buffer.

Depending on the size of the history buffer and the amount of stored data therein, there can be a large number of comparison elements in the comparator and therefore a large number of match identifiers returned. From among these matches, a longest match is to be determined in order to output appropriate commands for substrings from the command generator. The comparator therefore provides the matches to a match detector. The match detector determines, using a respective match pipeline, a longest match for each substring (step 906). As described above, each match pipeline includes one or more longest match selection stages (e.g., longest match selection stages 632-638) in which matches are compared to other matches by length to eliminate shorter matches until only a single longest match for the substring remains.

Figure 10:
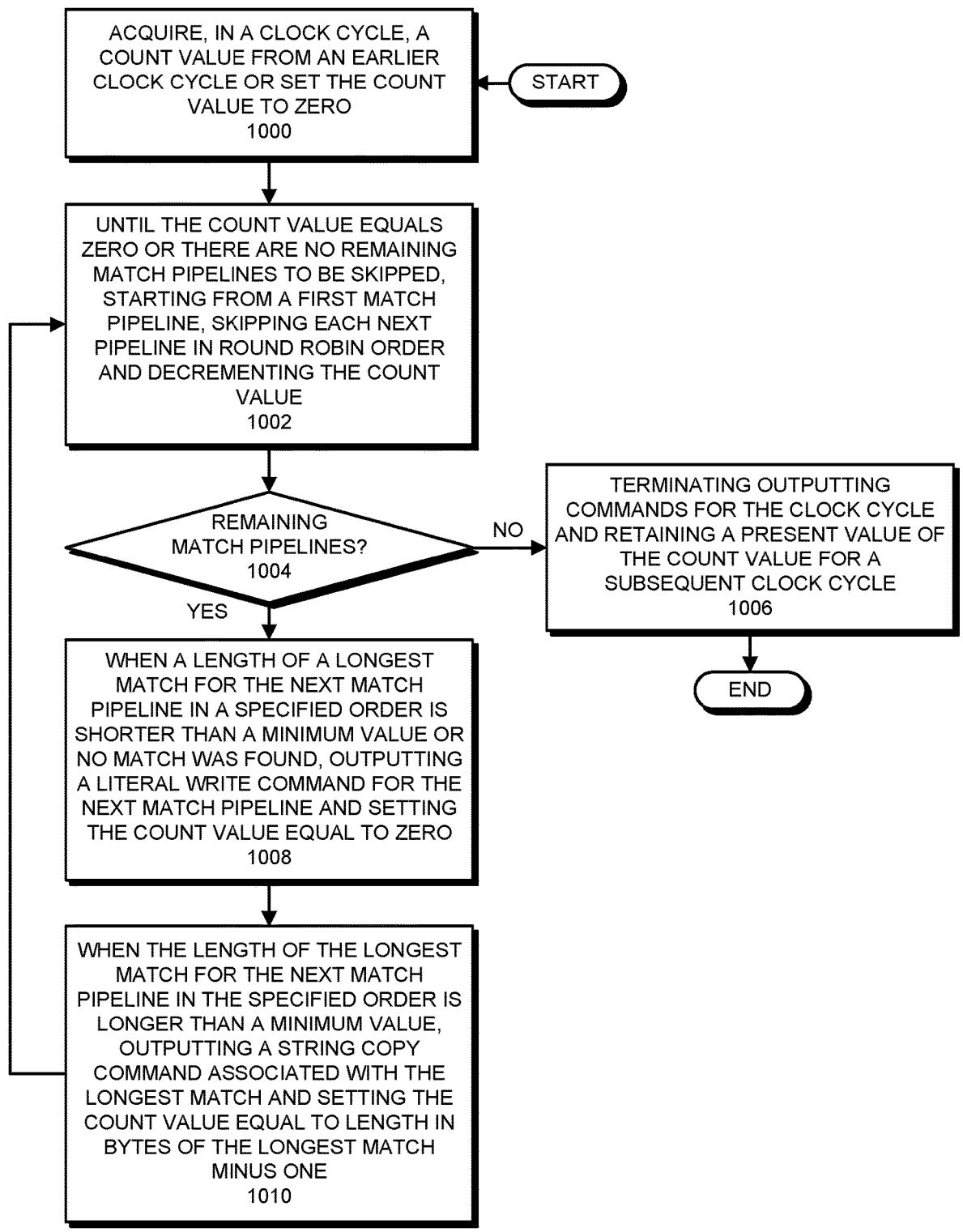
FIG. 10 presents a block diagram illustrating a process for selectively outputting commands from a command generator in accordance with some embodiments.

Based on the longest match for each substring, the command generator selectively outputs commands for the compressed data (step 908). For this operation, the command generator outputs at least one command based on the longest matches, and may output as many commands as there are substrings. FIG. 10 presents a block diagram illustrating a process for selectively outputting commands in accordance with some embodiments. Note that the operations shown in FIG. 10 are presented as a general example of operations performed by some embodiments. The operations performed by other embodiments include different operations, operations that are performed in a different order, and/or operations that are performed by different entities or functional blocks.

As can be seen in FIG. 10, the process starts when the command generator acquires, in a cycle of the clock (i.e., at the commencement of a current cycle of the clock), a count value from an earlier cycle of the clock or sets the count value to zero (step 1000). For this operation, it is assumed that the command generator keeps a count of bytes of a longest match used in a current cycle of the clock or used in a previous cycle of the clock for generating a command. The count is then used to control which subsequent longest matches are discarded and which are used for generating commands.

The command generator next, until the count value equals zero or there are no remaining match pipelines—and thus longest matches—to be skipped, starting from a first match pipeline, skips each next pipeline in round robin order and decrements the count value (step 1002). For this operation, the command generator skips over longest matches from match pipelines such as is described above for FIG. 7A—and discards the longest matches from the skipped match pipelines. When all match pipelines are skipped (step 1004), the command generator terminates processing match pipelines for the cycle of the clock without outputting a command (step 1006). This outcome can occur when a longest match from a previous cycle of the clock was sufficiently long to render all of the longest matches in the cycle of the clock unusable—again, as shown in FIG. 7A.

On the other hand, when the count value is zero and one or more match pipelines have not been skipped (step 1004), one or more pipelines (and thus longest matches) remain to be processed in the cycle of the clock. In this case, when a length of a longest match for the next match pipeline in a specified order (e.g., round robin) is shorter than a threshold value or no match was found, the command generator outputs a literal write command for the next match pipeline and setting the count value equal to zero (step 1008). Otherwise, when the length of the longest match for the next match pipeline in the specified order is longer than the threshold value, the command generator outputs a string copy command associated with the longest match and setting the count value equal to length in bytes of the longest match minus one. Setting the count value in this way enables subsequent match pipelines in the cycle of the clock and subsequent cycles of the clock to be skipped based on the length of the longest match used for the string copy command—or not skipped when a literal write command is output. The command generator then returns to the skipping operation, i.e., returns to step 1002 to process the count value and possibly skip match pipelines, etc.

In some embodiments, at least one electronic device (e.g., electronic device 500) uses code and/or data stored on a non-transitory computer-readable storage medium to perform some or all of the operations herein described. More specifically, the at least one electronic device reads code and/or data from the computer-readable storage medium and executes the code and/or uses the data when performing the described operations. A computer-readable storage medium can be any device, medium, or combination thereof that stores code and/or data for use by an electronic device. For example, the computer-readable storage medium can include, but is not limited to, volatile and/or non-volatile memory, including flash memory, random access memory (e.g., eDRAM, RAM, SRAM, DRAM, DDR4 SDRAM, etc.), non-volatile RAM (e.g., phase change memory, ferroelectric random access memory, spin-transfer torque random access memory, magnetoresistive random access memory, etc.), read-only memory (ROM), and/or magnetic or optical storage mediums (e.g., disk drives, magnetic tape, CDs, DVDs, etc.).

In some embodiments, one or more hardware modules perform the operations herein described. For example, the hardware modules can include, but are not limited to, one or more processors/cores/central processing units (CPUs), application-specific integrated circuit (ASIC) chips, neural network processors or accelerators, field-programmable gate arrays (FPGAs), compression and/or encoding subsystems, compute units, embedded processors, graphics processors (GPUs)/graphics cores, pipelines, accelerated processing units (APUs), functional blocks, controllers, accelerators, and/or other programmable-logic devices. When such hardware modules are activated, the hardware modules perform some or all of the operations. In some embodiments, the hardware modules include one or more general purpose circuits that are configured by executing instructions (program code, firmware, etc.) to perform the operations.

In some embodiments, a data structure representative of some or all of the structures and mechanisms described herein (e.g., electronic device 500 or some portion thereof) is stored on a non-transitory computer-readable storage medium that includes a database or other data structure which can be read by an electronic device and used, directly or indirectly, to fabricate hardware including the structures and mechanisms. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates/circuit elements from a synthesis library that represent the functionality of the hardware including the above-described structures and mechanisms. The netlist may then be placed and routed to produce a data set describing geometric shapes to be applied to masks. The masks may then be used in various semiconductor fabrication steps to produce a semiconductor circuit or circuits (e.g., integrated circuits) corresponding to the above-described structures and mechanisms. Alternatively, the database on the computer accessible storage medium may be the netlist (with or without the synthesis library) or the data set, as desired, or Graphic Data System (GDS) II data.

In this description, variables or unspecified values (i.e., general descriptions of values without particular instances of the values) are represented by letters such as N, M, and X. As used herein, despite possibly using similar letters in different locations in this description, the variables and unspecified values in each case are not necessarily the same, i.e., there may be different variable amounts and values intended for some or all of the general variables and unspecified values. In other words, N and any other letters used to represent variables and unspecified values in this description are not necessarily related to one another.

The expression "et cetera" or "etc." as used herein is intended to present an and/or case, i.e., the equivalent of "at least one of" the elements in a list with which the etc. is associated. For example, in the statement "the electronic device performs a first operation, a second operation, etc.," the electronic device performs at least one of the first operation, the second operation, and other operations. In addition, the elements in a list associated with an etc. are merely examples from among a set of examples—and at least some of the examples may not appear in some embodiments.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. An electronic device that generates compressed data from original data, the electronic device comprising:
 a compression subsystem configured to, starting in each cycle of a clock, process a search string to generate commands for the compressed data, the search string including a subset of bytes from the original data, and the processing including:
  comparing each substring of a plurality of substrings from the search string with stored data from a history buffer to find matches between the substrings and the stored data;
  determining a longest match for each of the substrings from among matches for that substring, by, in stages of a respective match pipeline for that substring, eliminating matches from among matches for that substring based on comparisons of lengths of matches, wherein a final stage of the respective match pipeline outputs the longest match for that substring; and
  based on the longest matches for the substrings, selectively outputting commands to be included in the compressed data.

2. The electronic device of claim 1, wherein:
 when comparing each of the substrings with the stored data from the history buffer to find the matches, the compression subsystem is configured to:
  provide the substring and comparison strings from the stored data as inputs to corresponding elements of comparison elements, each comparison string being of a specified length in bytes and including a different ordered sequence of bytes from the stored data; and
  receive, as an output of the corresponding elements, an identifier for each match that indicates a length of the match.

3. The electronic device of claim 2, wherein:
 the identifier includes a sequence of bits that includes a separate bit for each byte of the substring; and
 the corresponding elements are configured to output a first value for each bit where respective bytes of the substring and the comparison string match and a second value for each bit where respective bytes of the substring and the comparison string do not match.

4. The electronic device of claim 1, wherein:
 the compression subsystem includes a plurality of match pipelines, each match pipeline including a plurality of stages of longest match selectors arranged in a sequence; and
 when determining the longest match for each of the substrings, the compression subsystem is configured to:
  receive, in a corresponding one of the match pipelines, matches for the substring; and
  in each stage of the plurality of stages in the corresponding one of the match pipelines, eliminate local shorter matches from among groups of matches and provide remaining local longest matches as matches for a next stage of the match pipeline, wherein a final stage of the stages eliminates local shorter matches from among a final group of matches and outputs the longest match for that substring.

5. The electronic device of claim 4, wherein, when selectively outputting the commands to be included in the compressed data, the compression subsystem is configured to, in a cycle of the clock:
 starting from a given match pipeline, in round robin order, skip match pipelines that are not to be processed in the cycle of the clock due to a previous longest match;
 when all of the match pipelines are skipped, terminate processing match pipelines for the cycle of the clock without outputting a command;
 when one or more match pipelines are not skipped and thus remain to be processed, output, for a next match pipeline in a specified order, a command based on a length of the longest match for the next match pipeline; and
 process or skip remaining match pipelines in the cycle of the clock based on the length of the longest match for the next match pipeline.

6. The electronic device of claim 5, wherein the specified order is one of:
 round robin order; or
 an order that is determined based on the longest matches for each of the match pipelines that remain to be processed.

7. The electronic device of claim 5, wherein, when outputting the command, the compression subsystem is configured to:
 when no match was found or the longest match is shorter than a threshold length, output a literal write command; and
 when the longest match is longer than the threshold length, output a string copy command.

8. The electronic device of claim 4, wherein, when selectively outputting the commands to be included in the compressed data, the compression subsystem is configured to, in a cycle of the clock:
 acquire a non-zero count value, if any, from an earlier cycle of the clock or set the count value to zero;
 until the count value equals zero or there are no remaining match pipelines to be skipped, starting from a first match pipeline, skip each next pipeline in round robin order and decrement the count value;
 when there are no remaining match pipelines to be skipped, terminate outputting commands for the cycle of the clock and retain a present value of the count value for a subsequent cycle of the clock; and
 when the count value is zero and one or more match pipelines have not been skipped:
  when a length of a longest match for a next match pipeline in a specified order is shorter than a threshold value or no match was found, output a literal write command for the next match pipeline and set the count value equal to zero; and
  when the length of the longest match for the next match pipeline in the specified order is longer than the threshold value, output a string copy command associated with the longest match and set the count value equal to a length in bytes of the longest match minus one; and
  return to the skipping operation.

9. The electronic device of claim 1, wherein:
 each substring is of a specified length in bytes and includes a different ordered sequence of bytes from the search string;
 the search string includes a number of bytes that is a given number of bytes longer than the specified length in bytes of the substrings; and
 the substrings include each different sequential substring from the search string, with a first substring of the substrings starting from a first byte of the search string and each next substring of the substrings starting from an incrementally longer offset in bytes from the first byte.

10. The electronic device of claim 1, wherein the compression subsystem is configured to, in each cycle of the clock:
acquire the search string from the original data; and
provide the search string for the comparing operation.

11. The electronic device of claim 10, wherein the compression subsystem is configured to, after providing the search string for the comparing operation in each cycle of the clock:
shift a specified number of bytes of data off of the original data; and
add the specified number of bytes of the data to the stored data in the history buffer.

12. The electronic device of claim 10, wherein:
the search string includes a number of bytes from the original data starting from a starting byte in the original data: and
after providing the search string for the comparing operation in each cycle of the clock, the compression subsystem is configured to:
increment the starting byte by a specified number of bytes, thereby configuring the compression subsystem to process a next search string in a next cycle of the clock.

13. The electronic device of claim 1, further comprising:
a receiving entity configured to receive the commands from the compression subsystem and use the commands for one or more subsequent operations.

14. A method for generating compressed data from original data, the method comprising:
starting in each cycle of a clock, processing a search string to generate commands for the compressed data, the search string including a number of bytes from the original data, the processing including:
comparing each substring of a plurality of substrings from the search string with stored data from a history buffer to find matches between the substrings and the stored data;
determining a longest match for each of the substrings from among matches for that substring, by, in stages of a respective match pipeline for that substring, eliminating matches from among matches for that substring based on comparisons of lengths of matches, wherein a final stage of the respective match pipeline outputs the longest match for that substring; and
selectively outputting, based on the longest matches for the substrings, commands to be included in the compressed data.

15. The method of claim 14, wherein
comparing each of the substrings with the stored data from the history buffer to find the matches includes, for each of the substrings:
providing the substring and comparison strings from the stored data as inputs to corresponding elements of comparison elements, each comparison string being of a specified length in bytes and including a different ordered sequence of bytes from the stored data; and
receiving, as an output of the corresponding elements, an identifier for each match that indicates a length of the match.

16. The method of claim 15, wherein:
the identifier includes a sequence of bits that includes a separate bit for each byte of the substring; and
the corresponding elements output a first value for each bit where respective bytes of the substring and the comparison string match and a second value for each bit where respective bytes of the substring and the comparison string do not match.

17. The method of claim 14, wherein:
determining the longest match for each of the substrings includes:
receiving, in a corresponding match pipeline from among a plurality of match pipelines, matches for that substring, wherein each match pipeline includes a plurality of stages of longest match selectors arranged in a sequence; and
in each stage of the plurality of stages in the corresponding match pipeline, eliminating local shorter matches from among groups of matches and providing remaining local longest matches as matches for a next stage of the match pipeline, a final stage of the stages eliminating local shorter matches from among a final group of matches and outputting the longest match for that substring.

18. The method of claim 17, wherein selectively outputting the commands to be included in the compressed data includes, in a cycle of the clock:
starting from a given match pipeline, in round robin order, skipping match pipelines that are not to be processed in the cycle of the clock due to a previous longest match;
when all of the match pipelines are skipped, terminating processing match pipelines for the cycle of the clock without outputting a command;
when one or more match pipelines are not skipped and thus remain to be processed, outputting, for a next match pipeline in a specified order, a command based on a length of the longest match for the next match pipeline; and
processing or skipping remaining match pipelines in the cycle of the clock based on the length of the longest match for the next match pipeline.

19. The method of claim 18, wherein outputting the command includes:
when no match was found or the longest match is shorter than a threshold length, outputting a literal write command; and
when the longest match is longer than the threshold length, outputting a string copy command.

20. The method of claim 17, wherein selectively outputting the commands to be included in the compressed data includes, in a cycle of the clock:
acquiring a non-zero count value, if any, from an earlier cycle of the clock or setting the count value to zero;
until the count value equals zero or there are no remaining match pipelines to be skipped, starting from a first match pipeline, skipping each next pipeline in round robin order and decrementing the count value;
when there are no remaining match pipelines to be skipped, terminating outputting commands for the cycle of the clock and retaining a present value of the count value for a subsequent cycle of the clock; and
when the count value is zero and one or more match pipelines have not been skipped:
when a length of a longest match for a next match pipeline in a specified order is shorter than a threshold value or no match was found, outputting a literal write command for the next match pipeline and setting the count value equal to zero; and
when the length of the longest match for the next match pipeline in the specified order is longer than the threshold value, outputting a string copy command associated with the longest match and setting the count value equal to a length in bytes of the longest match minus one; and returning to the skipping operation.

21. The method of claim 14, wherein:

each substring is of a specified length in bytes and includes a different ordered sequence of bytes from the search string;

the search string includes a number of bytes that is a given number of bytes longer than the specified length in bytes of the substrings; and the substrings include each different sequential substring from the search string, with a first substring of the substrings starting from a first byte of the search string and each next substring of the substrings starting from an incrementally longer offset in bytes from the first byte.

22. The method of claim 14, further comprising, in each cycle of the clock:

acquiring the search string from the original data; and providing the search string to for the comparing operation.

23. The method of claim 22, further comprising, after providing the search string for the comparing operation in each cycle of the clock:

shifting a specified number of bytes of data off of the original data; and adding the specified number of bytes of the data to the stored data in the history buffer.

24. The method of claim 22, wherein:

the search string includes a number of bytes from the original data starting from a starting byte in the original data: and the method further comprises, after providing the search string for the comparing operation in each cycle of the clock:

incrementing the starting byte by a specified number of bytes, thereby configuring the compression subsystem to process a next search string in a next cycle of the clock.

* * * * *